(12) United States Patent
Jo et al.

(10) Patent No.: US 10,582,649 B2
(45) Date of Patent: Mar. 3, 2020

(54) HEAT EXCHANGER FOR COOLING ELECTRICAL DEVICE

(71) Applicant: Hanon Systems, Daejeon (KR)

(72) Inventors: Wi Sam Jo, Daejeon (KR); Jun Young Song, Daejeon (KR); Hong-Young Lim, Daejeon (KR); Dong Suk Lee, Daejeon (KR); Sun Mi Lee, Daejeon (KR)

(73) Assignee: Hanon Systems, Daejeon (KR)

( * ) Notice: Subject to any disclaimer, the term of this patent is extended or adjusted under 35 U.S.C. 154(b) by 0 days.

(21) Appl. No.: 15/755,918

(22) PCT Filed: Dec. 28, 2016

(86) PCT No.: PCT/KR2016/015370
§ 371 (c)(1),
(2) Date: Feb. 27, 2018

(87) PCT Pub. No.: WO2017/116128
PCT Pub. Date: Jul. 6, 2017

(65) Prior Publication Data
US 2018/0328675 A1  Nov. 15, 2018

(30) Foreign Application Priority Data

Dec. 30, 2015 (KR) .......................... 10-2015-0189485

(51) Int. Cl.
*H05K 7/20* (2006.01)
*H01L 23/473* (2006.01)
(Continued)

(52) U.S. Cl.
CPC .......... *H05K 7/20927* (2013.01); *F28F 3/08* (2013.01); *F28F 9/0253* (2013.01); *F28F 9/12* (2013.01);
(Continued)

(58) Field of Classification Search
CPC .......... H05K 7/20872; H05K 7/20927; H05K 7/20254; H05K 7/1432; F28D 9/00–04;
(Continued)

(56) References Cited

U.S. PATENT DOCUMENTS

| 7,200,007 B2* | 4/2007 | Yasui | H02M 7/003 165/80.4 |
| 7,508,668 B2* | 3/2009 | Harada | H01L 25/072 361/689 |
| 9,627,294 B2* | 4/2017 | Kakiuchi | H01L 23/473 |
| 2005/0121173 A1* | 6/2005 | Inagaki | F28D 1/0325 165/80.3 |
| 2007/0044952 A1* | 3/2007 | Kuno | H01L 23/473 165/287 |

(Continued)

FOREIGN PATENT DOCUMENTS

| CN | 102209454 A | 10/2011 |
| CN | 104838510 A | 8/2015 |

(Continued)

*Primary Examiner* — Zachary Pape
(74) *Attorney, Agent, or Firm* — Norton Rose Fulbright US LLP

(57) ABSTRACT

The present invention relates to a heat exchanger for cooling an electrical device, and more specifically, to a heat exchanger for cooling an electrical device, the heat exchanger being mechanically assembled through connection blocks while stacking a cooling flow path, which forms a cooling water flow path, and the electrical devices, thereby facilitating the insertion of the electrical devices and enabling pressing force between the cooling flow path and the electrical device to increase, such that cooling performance is improved.

14 Claims, 8 Drawing Sheets

(51) Int. Cl.
 *F28F 3/08* (2006.01)
 *H01H 9/52* (2006.01)
 *H01L 23/40* (2006.01)
 *F28F 9/02* (2006.01)
 *F28F 9/12* (2006.01)

(52) U.S. Cl.
 CPC ........ *H01L 23/473* (2013.01); *F28F 2230/00* (2013.01); *H01H 9/52* (2013.01); *H01L 23/4012* (2013.01); *H05K 7/20254* (2013.01)

(58) Field of Classification Search
 CPC . F28D 9/0043; F28D 9/0246; H01L 23/4012; H01L 23/473; H01H 9/22–226; H01H 9/52; F28F 3/08; F28F 3/10; F28F 3/00; F28F 1/40; F28F 9/0253; F28F 9/12
 USPC .............. 361/699, 715–716; 165/80.4–80.5, 165/104.33; 257/714
 See application file for complete search history.

(56) References Cited

U.S. PATENT DOCUMENTS

| | | | |
|---|---|---|---|
| 2009/0159250 A1* | 6/2009 | Cho | F28D 7/0041 165/167 |
| 2013/0003301 A1* | 1/2013 | Miyamoto | H01L 23/473 36/699 |
| 2014/0092663 A1* | 4/2014 | Shimizu | H02M 7/003 363/141 |

FOREIGN PATENT DOCUMENTS

| | | |
|---|---|---|
| JP | 2004214623 A | 7/2004 |
| JP | 2006005014 A | 1/2006 |
| JP | 2008016718 A | 1/2008 |
| JP | 2012099748 A | 5/2012 |
| WO | 2012098572 A1 | 7/2012 |

\* cited by examiner h1 ≠ h2 ≠ h3

HEAT EXCHANGER FOR COOLING ELECTRICAL DEVICE

This application is a 371 of International Application No. PCT/KR2016/015370 filed Dec. 28, 2016, which claims priority from Korean Patent Application No. 10-2015-0189485 filed Dec. 30, 2015.

TECHNICAL FIELD

The present invention relates to a heat exchanger for cooling an electrical device, and more particularly, to a heat exchanger for cooling an electrical device, the heat exchanger being mechanically assembled through connection blocks while stacking a cooling flow path, which forms a cooling water flow path, and the electrical devices, thereby facilitating the insertion of the electrical devices and enabling pressing force between the cooling flow path and the electrical device to increase, such that cooling performance is improved.

BACKGROUND ART

As a part of environmental pollution measures, the development of a hybrid vehicle using a torque of a motor, a fuel cell vehicle, an electric vehicle, and so on has recently been in the limelight. The vehicles as described above are generally equipped with a power control unit (PCU) controlling power supplied from a driving battery (for example, voltage of 300 V) to be supplied to a motor in a desired state.

The PCU includes electrical devices such as an inverter, a smoothing condenser, and a converter. If the electrical devices are supplied with electricity, the electrical devices generate heat. Therefore, the electrical devices have to include a separate cooler.

As the relevant technologies, Japanese Patent Laid-Open Publication No. 2001-245478 (Published On Sep. 7, 2001, Title: Cooler for inverter) discloses an inverter using a semiconductor module having semiconductor devices of IGBT, etc. and a diode embedded therein and Japanese Patent Laid-open Publication No. 2008-294283 (Published on Dec. 4, 2008, Title: Semiconductor Device) discloses a heat sink installed to contact a lower side surface of a semiconductor device and having a fluid flowing thereinto to exchange heat.

The single side cooling scheme has a limit of cooling performance. To improve the above problem, a dual side cooling scheme is devised. The dual side cooling scheme has a structure in which an element is inserted into a space between heat exchangers, and therefore should satisfy all the conditions that an insertion interval of the electrical device of the heat exchanger needs to be higher than a height of the electrical device and the electrical device and the heat exchanger need to be pressed to each other well to increase heat transfer performance of the heat exchanger.

As illustrated in FIG. 1, the heat exchanger based on the dual side cooling scheme may be configured to include tubes 20 positioned on both side surfaces of the electrical device 10 and having a heat exchange medium flowing thereinto and tanks 30 coupled with both ends of the tubes and having the heat exchange medium introduced into or discharged, therefrom. However, the heat exchanger should be brazed to fix the insertion space of the electrical device and then insert the electrical device, and as a result it has the disadvantage in that it is difficult to perform the insertion operation of the electrical device.

Further, if the interval between the tubes is wide to facilitate the insertion of the electrical device, the heat exchanger has a disadvantage in that the electrical device and the tube are not pressed to each other and thus the heat exchange efficiency is reduced.

Therefore, there is a need to develop a heat exchanger for cooling an electrical device capable of facilitating the insertion of the electrical device and pressing the electrical device and the heat exchanger to each other well.

DISCLOSURE

Technical Problem

An object of the present invention is to provide to a heat exchanger for cooling an electrical device in which first and second cooling flow paths constituting a cooling water flow path are assembled by a connection block while being stacked to increase a pressing force between the first and second cooling flow paths and the electrical device as well as facilitate an insertion of the electrical device, thereby improving cooling performance.

Technical Solution

In one general aspect, a heat exchanger for cooling an electrical device includes: a first cooling flow path 110 and a second cooling flow path 120 having cooling water flowing thereinto and alternately stacked to each other; an inlet pipe 210 and an outlet pipe 220 connected to both ends of the first cooling flow path 110 and the second cooling flow path 120, the inlet pipe 210 having the cooling water introduced thereinto and the outlet pipe 220 discharging the cooling water therethrough; and a connection block 400 communicating with the inlet pipe 210 and the outlet pipe 220 and connected between the first cooling flow path 110 and the second cooling flow path 120 stacked in plural to form a connection channel in a stacking direction.

A plurality of electrical devices 2 may be inserted between the first cooling flow path 110 and the second cooling flow path 120 to be cooled.

The heat exchanger 1 may further include: a 1-1-th protrusion 111 whose some area of one end protrudes in a longitudinal direction of the first cooling flow path 110 and a 1-2-th protrusion 112 whose some area of the other end protrudes; and a 2-1-th protrusion 121 whose some area of one end protrudes in a longitudinal direction of the second cooling flow path 121 and a 2-2-th protrusion 122 whose some area of the other end protrudes, wherein the 1-1-th protrusion 111 and the 2-1-th protrusion 121 and the 1-2-th protrusion 112 and the 2-2-protrusion 122 do not overlap with each other in a height direction.

The heat exchanger 1 may further include: an inlet block 310 including an inlet passage 311 communicating with the inlet pipe 210, a first inlet passage 312 branched from the inlet passage 311 so that the cooling water introduced through the inlet passage 311 flows in the first cooling flow path 110, and a second inlet passage 313 branched from the inlet passage 311 so that the cooling water introduced through the inlet passage 311 flows in the second cooling flow path 120; and an outlet block 320 including a first outlet passage 322 connected to the first cooling flow path 110, a second outlet passage 323 connected to the second cooling flow path, and an outlet passage 321 connecting between the first outlet passage 322, the second outlet passage 323, and the outlet pipe 220 so that the cooling water discharged through the first outlet passage 322 and the second outlet passage 323 are joined to be discharged to the outlet pipe 220.

The heat exchanger 1 may further include: a 1-1-th connection pipe 331 connected between the first inlet passage 312 of the inlet block 310 and the 1-1-th protrusion 111; a 2-1-th connection pipe 332 connected between the second inlet passage 313 of the inlet block 310 and the 2-1-th protrusion 121; a 1-2-th connection pipe 341 connected between the first, outlet passage 322 of the outlet block 320 and the 1-2-th protrusion 112; and a 2-2-th connection pipe 342 connected between the second outlet passage 323 of the outlet block 320 and the 2-2-th protrusion 122.

The heat exchanger 1 may further include: a first flange 330 having the 1-1-th connection pipe 331 and the 2-1-th connection pipe 332 inserted thereinto and supporting the inlet block 310; and a second flange 340 having the 1-2-th connection pipe 341 and the 2-2-th connection pipe 342 inserted thereinto and supporting the outlet block 320.

The heat exchanger 1 may further include: a connector 350 that connects between the first cooling flow path 110, the 1-1-th connection pipe 331, and the 1-2-th connection pipe 341 and connects between the second cooling flow path 120, the 2-1-th connection pipe 332, and the 2-2-th connection pipe 342.

The inlet block 310, the 1-1-th connection pipe 331, the 2-1-th connection pipe 332, and the connector 350 may be integrally formed, and the outlet block 320, the 1-2-th connection pipe 341, the 2-2-th connection pipe 342, and the connector 350 may be integrally formed.

The connection block 400 may include: an upper connection block 410 being in contact with the first cooling flow path 110 or the second cooling flow path 120 that is connected to the inlet block 310 and the outlet block 320 and including a first communication passage 411 that communicates with the first inlet passage 312, the second inlet passage 313, the first outlet passage 322, or the second, outlet passage 323; a lower connection block 420 being in contact with the first cooling flow path 110 or the second cooling flow path 120 connected to the first connection block 400 or the first cooling flow path 110 or the second cooling flow path 120 alternately stacked to each other, and including a second communication passage 421 communicating with the first communication passage 411; and a sealing member 430 coupled to a part where the upper connection block 410 and the lower connection block 420 are coupled to prevent the cooling water from being leaked.

The sealing member 430 may be an o-ring or a liquid gasket.

A height of the connection block 400 may be equal to a height of any one of the first cooling flow path 110 and the second cooling flow path 120 and a sum of heights of two electrical devices 2.

The first cooling flow path 110 and the second cooling flow path 120 may have an inner fin inserted thereinto.

The first cooling flow path 110 and the second cooling flow path 120 may be a plate type in which two plates are coupled to each other to form a channel therein or a tube type.

The first cooling flow paths 110 and the second cooling flow paths 120 may each be alternately stacked to each other in at least one.

The electrical devices 2 may be each inserted into a gap formed by the multiple stacking of the first cooling flow path 110 and the second cooling flow path 120, and the gap between the first cooling flow path 110 and the second cooling flow path 120 may be changed according to heights of the electrical devices 2 inserted into each layer.

The first cooling flow path 110 and the second cooling flow path 120 may have a straight shape or have a shape in which some areas thereof are bent.

Advantageous Effects

According to the exemplary embodiment of the present invention, the heat exchanger for cooling an electrical device is mechanically assembled through connection blocks while stacking the cooling flow path, which forms the cooling water flow path, and the electrical devices, thereby facilitating the insertion of the electrical devices and enabling pressing force between the cooling flow path and the electrical device to increase, such that, cooling performance is improved.

In other words, to solve the problems that in the conventional double-sided cooling type heat exchanger, it is difficult to press the electrical device and the tube if the gap between the tubes is wide to facilitate the insertion, of the electrical device, whereas it is difficult to insert the electrical device if the gap between the tubes is narrow to press the electrical device and the tube, according to the exemplary embodiment of the present invention, the first and second cooling flow paths are each brazed and then the electrical device and the first and second cooling flow paths adhere to each other by applying a force in the stacking direction while the electrical device and the first and second cooling flow paths are assembled with each other by the connection block, thereby improving the cooling performance and greatly improving the assembling performance.

Further, according to the exemplary embodiment of the present invention, it is possible to easily cool the plurality of electrical devices and expand the application range by increasing the stacked number of first and second cooling flow paths when the number of electrical devices to be cooled is increased.

In addition, according to the exemplary embodiment of the present invention, it is possible to improve the cooling performance by inserting the inner fin into the first and second channels and configuring the cooling water flow paths in parallel.

Further, according to the exemplary embodiment of the present invention, the inlet and the outlet of the cooling water can be configured in the same direction, so the channel configuration can be simple and the space occupied in the vehicle can be minimized to facilitate the disposition of the peripheral components.

BEST MODE

Hereinafter, a heat exchanger for cooling an electrical device according to exemplary embodiments of the present invention will be described in detail with reference to the accompanying drawings.

Figure 1:
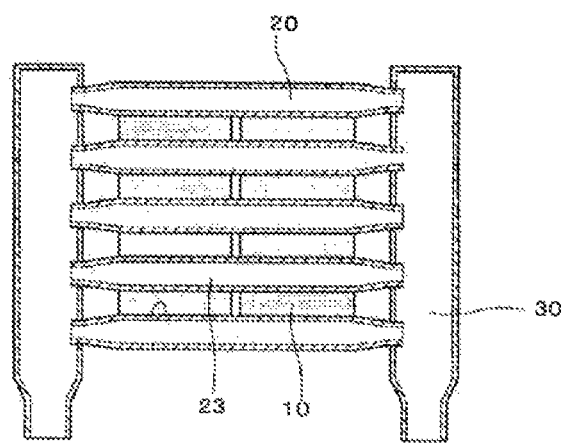
FIG. 1 is a side view illustrating an example of the existing cooler for an electrical device.
Figure 2:
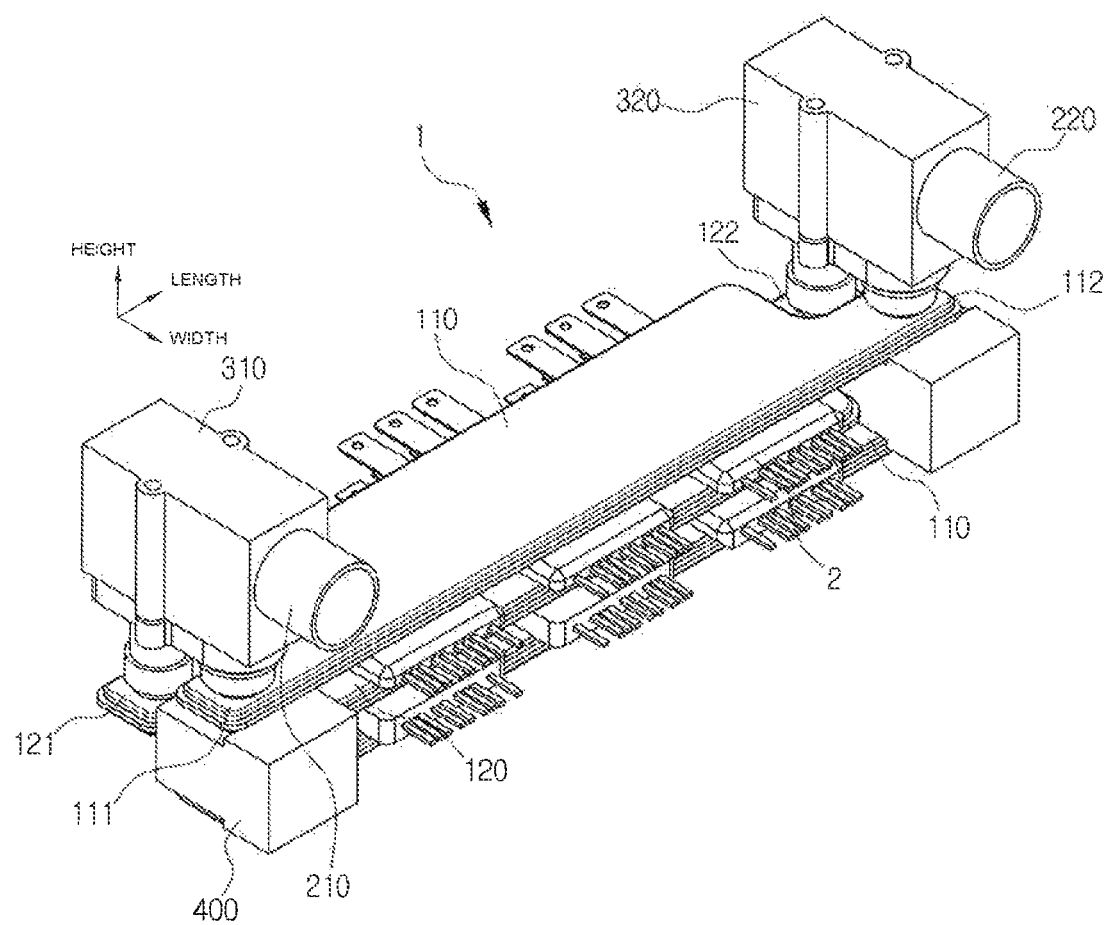
FIG. 2 is a perspective view illustrating a heat exchanger for cooling an electrical device according to an exemplary embodiment of the present invention.

As illustrated in FIG. 2, a heat exchanger 1 for cooling an electrical device according to an exemplary embodiment of the present invention largely includes a first cooling flow path 110, a second cooling flow path 120, an inlet pipe 210, an outlet pipe 220, and a connection block 400.

The first cooling flow path 110 and the second cooling flow path 120 which have cooling water flowing thereinto are alternately stacked to each other.

At this time, the first cooling flow path 110 and the second cooling flow path 120 are assembled in an independently brazed state, and if necessary, an inner fin may be inserted into the first cooling flow path 110 and the second cooling flow path 120 to further improve cooling efficiency.

In addition, the first cooling flow path 110 and the second cooling flow path 120 may be a plate type in which two plates are coupled to each other to form a channel therein or may be a tube type.

The inlet pipe 210 is coupled to one side in the longitudinal direction of the first cooling flow path and the second cooling flow path to receive cooling water, and the outlet pipe 220 is coupled to the other side in the longitudinal direction of the first cooling flow path and the second cooling flow path to discharge the cooling water.

The connection block 400 communicates with the inlet pipe 210 and the outlet pipe 220 and is connected between the first and second cooling flow paths which are stacked in plural to form a connection channel in the stacking direction.

Briefly describing the overall structure, in the heat exchanger 1 for cooling an electrical device according to the exemplary embodiment of the present invention, the first cooling flow path 110 and the second cooling flow path 120 are alternately stacked to each other. Among those, the connection block 400 is connected between the plurality of stacked channels to form, the connection channel in the stacking direction.

In addition, as the heat exchanger 1 for cooling an electrical device according to the exemplary embodiment of the present invention has one side connected to the inlet pipe 210 in a longitudinal direction and the other side connected to the outlet pipe 220, the cooling water introduced through the inlet pipe 210 moves along the connection channel formed in the stacking direction through the connection block 400 and then flows in the other side in the longitudinal direction within each of the first cooling flow path 110 and the second cooling flow path 120, and finally is discharged to the outside through the outlet pipe 220.

In this case, in the heat exchanger 1 for cooling an electrical device according to the exemplary embodiment of the present invention, the plurality of electrical devices 2 are inserted between the first cooling flow path 110 and the second cooling flow path 120, and the electrical devices 2 and the first cooling flow path 110 and the second cooling flow path 120 adhere to each other by forcing a force in the stacking direction while the electrical devices 2 are assembled with the first and second cooling flow paths by the connection block 400.

The electrical device 2 may be inserted between the first cooling flow path 110 and the second, cooling flow path 120, and may be disposed in plural while being spaced apart from each other at a predetermined interval in the longitudinal direction within the same plane.

More specifically, the first cooling flow path 110 includes a 1-1-th protrusion 111 whose some area of one end protrudes in a longitudinal direction and a 1-2-th protrusion 112 whose some area of the other end protrudes.

In addition, the second cooling flow path 120 includes a 2-1-th protrusion 121 whose some area of one end protrudes in a longitudinal direction and a 2-2-th protrusion 122 whose some area of the other end protrudes.

In particular, the 1-1-th protrusion 111 and the 2-1-th protrusion 122 are formed so as not to overlap each other in the height direction to be vertically connected to an inlet block 310 and an outlet block 320 to be described below.

Figure 3:
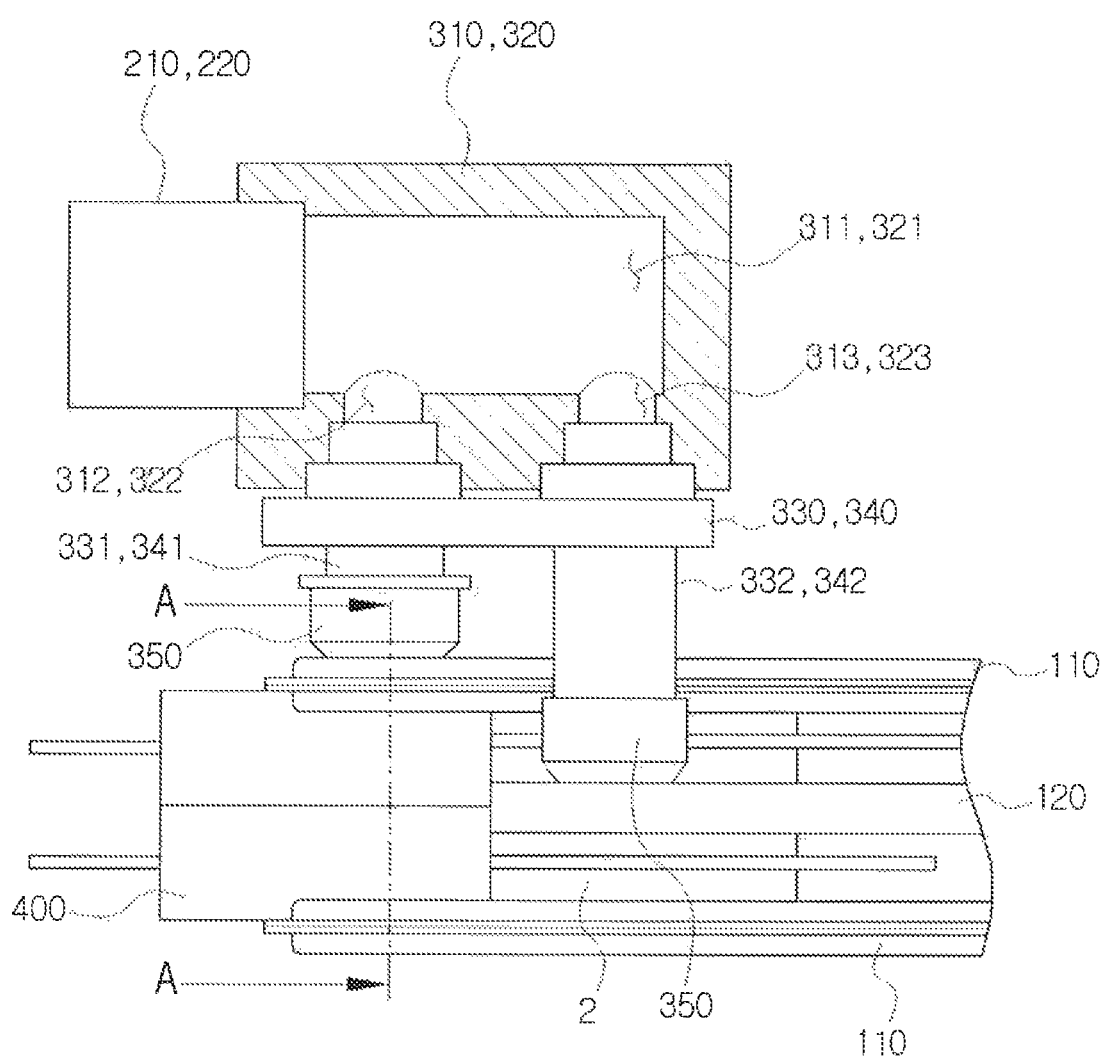
FIG. 3 is a cross-sectional view illustrating an inlet block in the heat exchanger for cooling an electrical device according to the exemplary embodiment of the present invention.

As illustrated in FIG. 3, the heat exchanger 1 for cooling an electrical device according to the exemplary embodiment of the present invention may further include the inlet block 310 connected to the inlet pipe 210, the outlet block 320 connected to the outlet pipe 220, a 1-1-th connection pipe 331 and a 2-1-th connection pipe 332 connected to the inlet block 310, and a 1-2-th connection pipe 341 and a 2-2-th connection pipe 342 connected to the outlet block 320.

First, the inlet block 310 may have an inlet passage 311, a first inlet passage 312, and a second inlet passage 313 penetrating therethrough, the inlet passage 311 communicating with the inlet pipe 210, the first inlet passage 312 branched from the inlet passage 311 so that the cooling water introduced through the inlet passage 311 flows in the first cooling flow path, and the second inlet passage 313 branched from the inlet passage 311 so that the cooling water introduced through the inlet passage 311 flows in the second cooling flow path. At this time, it is preferable that the first inlet, passage 312 and the second inlet passage 313 are formed to be perpendicular to the inlet passage 311 formed in the horizontal direction.

The outlet block 320 may include a first outlet passage 322 connected to the first cooling flow path 110, a second outlet passage 323 connected to the second cooling flow path, and an outlet passage 321 connecting between the first outlet passage 322, the second outlet passage 323, and the outlet pipe 220 so that the cooling water discharged through the first outlet passage 322 and the second outlet passage 323 are joined to be discharged to the outlet pipe 220. Like the inlet block 310, the first outlet passage 322 and the second outlet passage 323 may be formed to be perpendicular to the outlet passage 321 formed in the horizontal direction.

Next, the 1-1-th connection pipe 331 is formed to connect between the first inlet passage 312 of the inlet block 310 and the 1-1-th protrusion 111 in the vertical direction, and the 2-1-th connection pipe 332 is formed, to connect between the second inlet passage 313 of the inlet block 310 and the 2-1-th protrusion 121 in the vertical direction.

In this case, the 1-1-th and 2-1-th connection pipes 331 and 332 may be inserted into the lower part of the inlet block 310 and a first flange 330 supporting the inlet block 310 may be coupled thereto.

Next, the 1-2 connection pipe 341 is formed to connect between the first outlet passage 322 of the outlet block 320 and the 1-2th protrusion 112 in the vertical direction, and the 2-2-th connection pipe 342 is formed to connect between the second outlet passage 323 of the outlet block 320 and the 2-2-th protrusion 122 in the vertical direction.

In this case, the 1-2-th and 2-2-th connection pipes 341 and 342 may be inserted into the lower part of the outlet block 320 and a second flange 340 supporting the outlet block 320 may be coupled thereto.

As illustrated in FIGS. 2 and 3, the heat exchanger 1 for cooling an electrical device according to the exemplary embodiment of the present invention may include a connector 350 that connects between the first cooling flow path 110, the 1-1-th connection pipe 331, and the 1-2-th connection pipe 341 and connects between the second cooling flow path 120, the 2-1-th connection pipe 332, and the 2-2-th connection pipe 342.

The connector 350 may be brazed to a hole formed on the first cooling flow path 110 or the second cooling flow path 120 so that cooling water may be introduced or discharged. In this state, the 1-1-th connection pipe 331, the 1-2-th connection pipe 341, the 2-1-th connection pipe 332, and the 2-2-th connection pipe 342 may be fitted in the connector 350.

At this time, in the heat exchanger 1 for cooling an electrical device, the inlet block 310, the 1-1-th connection pipe 331, the 2-1-th connection pipe 332 and the connector 350 may be integrally formed, and the outlet block 320, the 1-2-th connection pipe 341, the 2-2-th connection pipe 342, and the connector 350 may be integrally formed.

Figure 4:
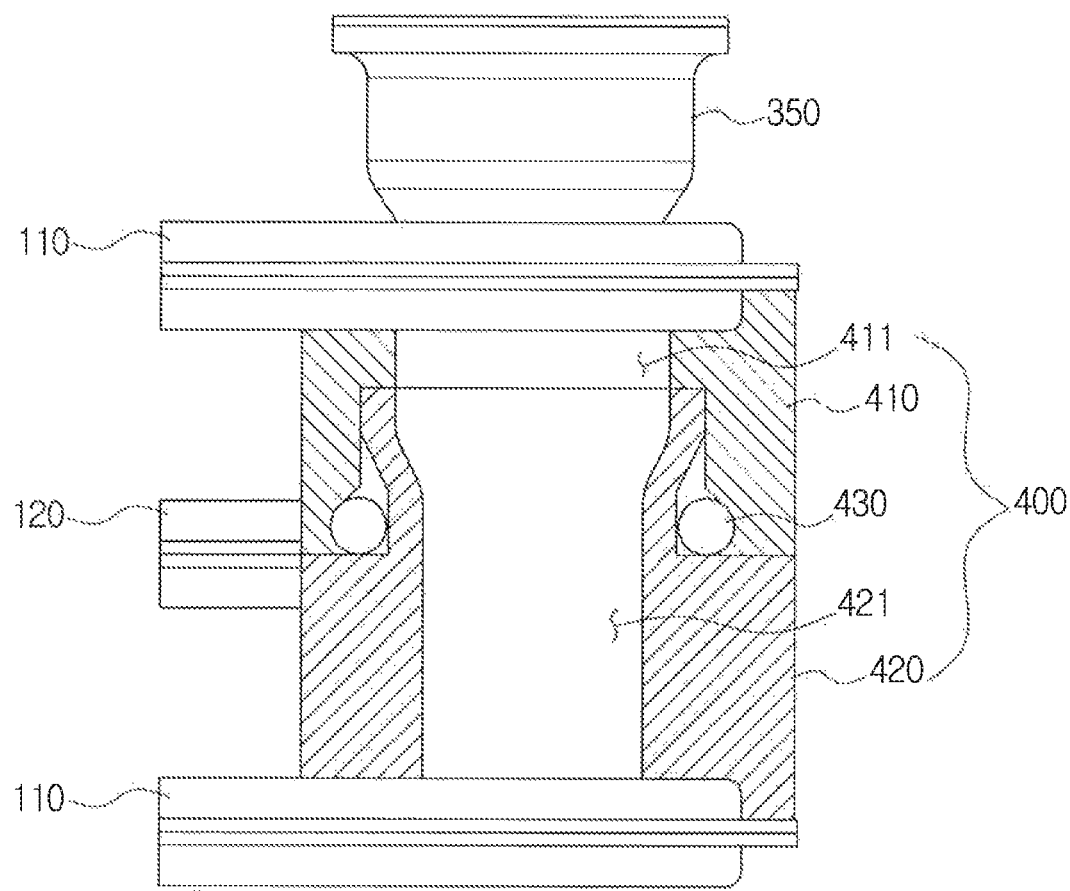
FIG. 4 is a cross-sectional view illustrating a connection block in the heat exchanger for cooling an electrical device according to the exemplary embodiment of the present invention.

Meanwhile, as illustrated in FIG. 4, the connection block 400 may include an upper connection block 410, a lower connection block 420, and a sealing member 430.

The upper connection block 410 is in contact with the first cooling flow path 110 or the second cooling flow path 120 that is connected to the inlet block 310 and the outlet block 320, and may include a first communication passage 411 that communicates with the first inlet passage 312, the second inlet passage 313, the first outlet passage 322, or the second outlet passage 323.

In addition, the lower connection block 420 may be in contact with the first cooling flow path 110 or the second cooling flow path 120 connected to the first connection block 400 or the first cooling flow path 110 or the second cooling flow path 120 alternately stacked to each other, and including a second communication passage 421 communicating with the first communication passage 411.

The sealing member 430 is coupled to a part where the upper connection block 410 and the lower connection block 420 are coupled to prevent the cooling water from being leaked. Here, the sealing member 430 may be an O-ring or may also be a member that is hardened like a liquid gasket.

Describing the connection block 400 connected to the left in the exemplary embodiment illustrated in FIG. 2, the upper connection block 410 is connected to a lower surface of the first cooling flow path 110 connected to the inlet block 310, the first communication passage 411 communicates with the first inlet passage 312, and the lower connection block 420 is coupled to the upper side of the first cooling flow path 110 stacked on the lowermost side.

At this time, considering the pressure in the stacking direction, the height of the connection block 400 may be equal to a height of any one of the first cooling flow path 110 and the second cooling flow path 120 and a sum of heights of two electrical devices 2.

Figure 6:
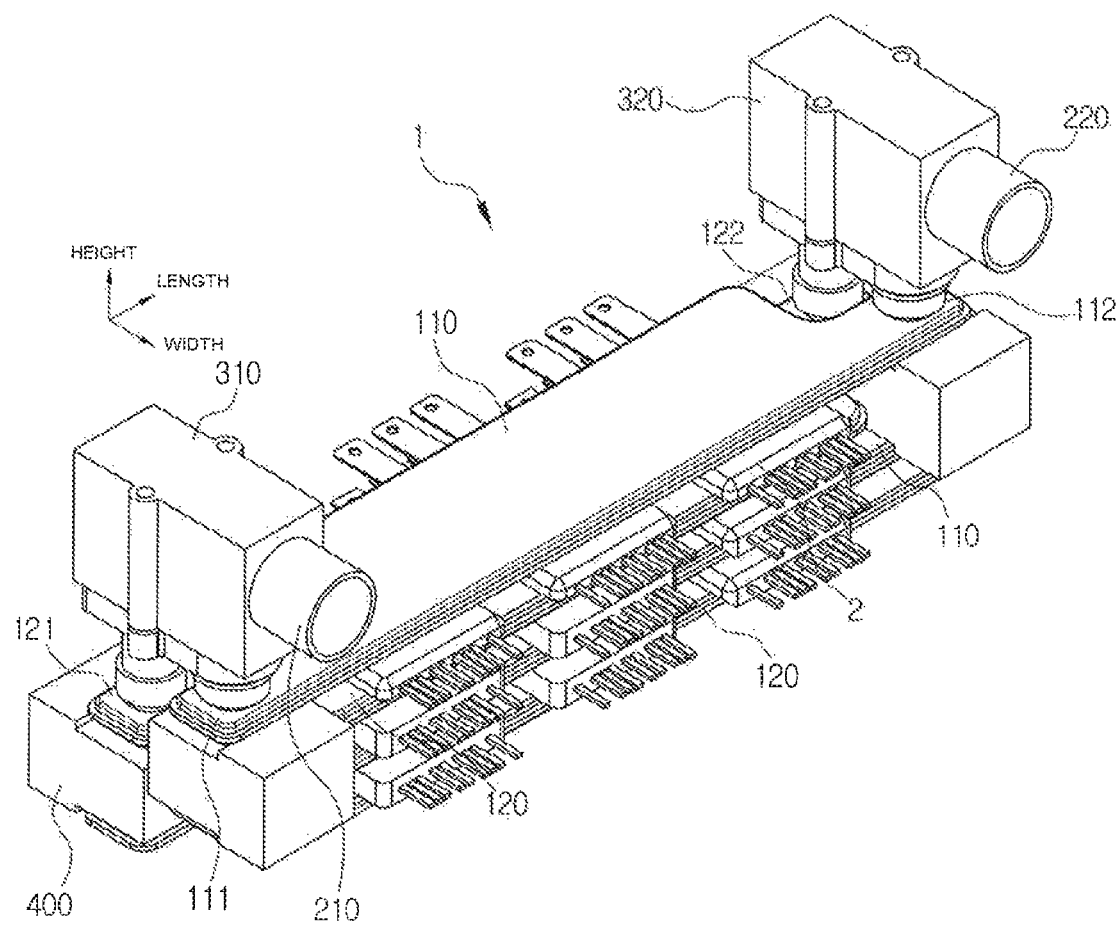
FIG. 6 is a perspective view illustrating a heat exchanger for cooling an electrical device according to another exemplary embodiment of the present invention.
Figure 7:
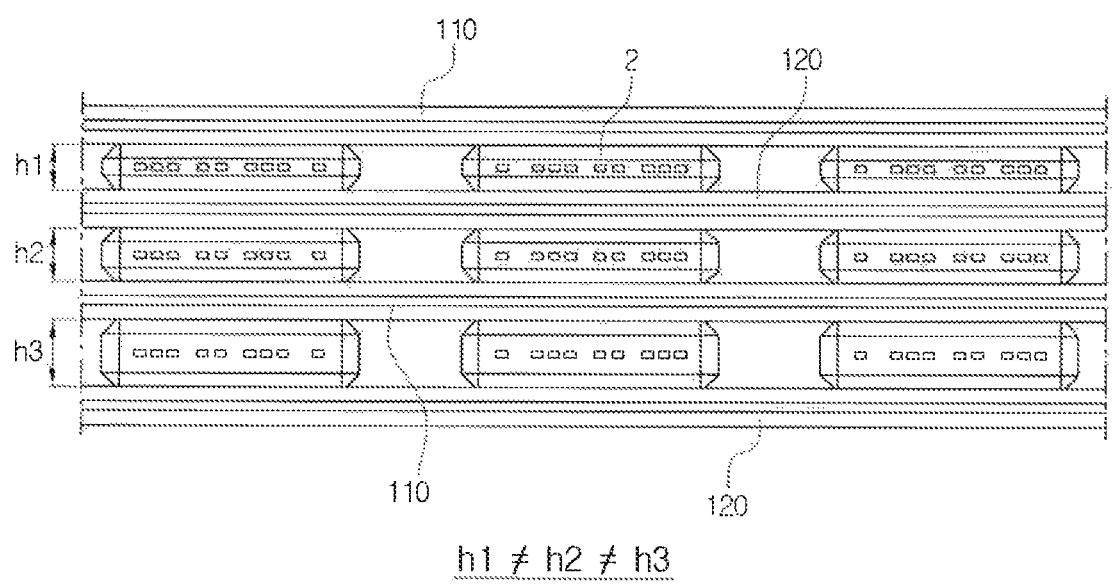
FIG. 7 is a front view illustrating the heat exchanger for cooling an electrical device according to another exemplary embodiment of the present invention.

Meanwhile, as shown in FIG. 6, the first cooling flow path 110 and the second cooling flow path 120 may be stacked in multiple stages. As shown in FIG. 7, in the heat exchanger for cooling an electrical device, the electrical devices 2 are each inserted into a gap formed by the multiple stacking of the first cooling flow path 110 and the second cooling flow path 120, and the gap between the first cooling flow path 110 and the second cooling flow path 120 may be changed according to the heights of the electrical devices 2 inserted into each layer.

In other words, when the height of the electrical device 2 interposed between the respective layers is different, in the heat exchanger 1 for cooling an electrical device, the electrical device 2 may adhere to the first cooling flow path 110 and the second cooling flow path 120 by adjusting the spacing distance between the first cooling flow path 110 and the second, cooling flow path 120 alternately stacked to the height of the electrical device 2.

Figure 8:
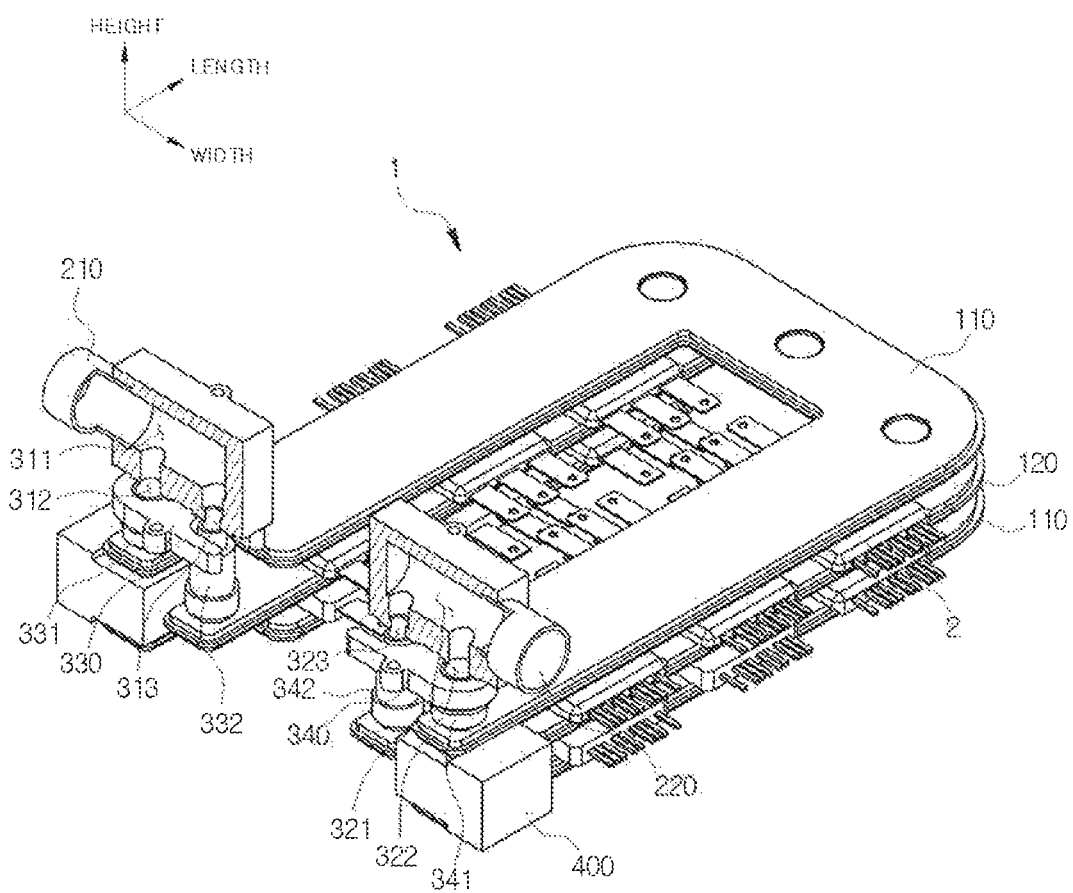
FIG. 8 is a perspective view illustrating a heat exchanger for cooling an electrical device according to another exemplary embodiment of the present invention.

According to another exemplary embodiment, as illustrated in FIG. 8, the first cooling flow path 110 and the second cooling flow path 120 may have a shape in which some areas thereof are bent, that is, a 'U'-letter shape. In this case, the electrical device 2 may be arranged in two rows in the same plane.

All the other components are the same as those illustrated in FIG. 2. However, the heat exchanger for cooling an electrical device may further include an interval maintaining means (not illustrated) that can maintain the gap between the first cooling flow path 110 and the second cooling flow path 120 positioned in the bent area and maintain the pressing force.

Figure 5:
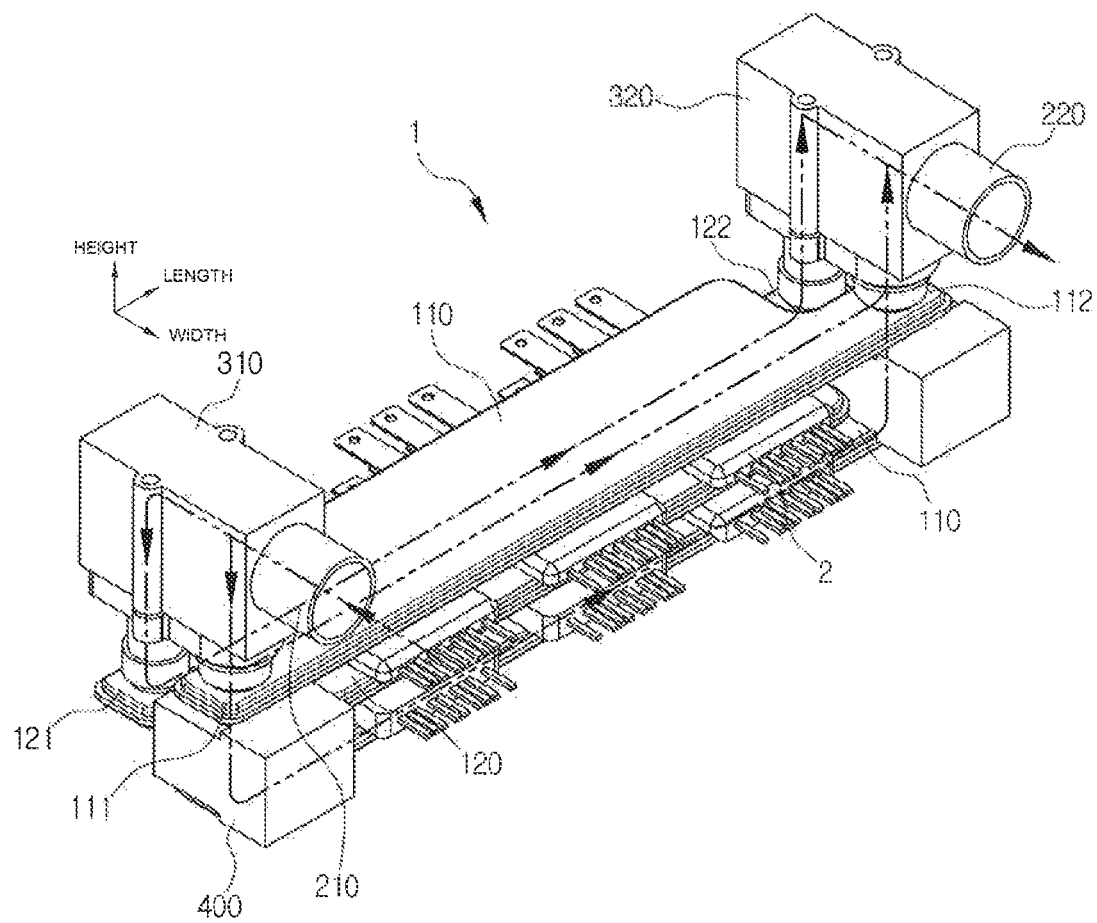
FIG. 5 is a diagram illustrating a flow of cooling water in the heat exchanger for cooling an electrical device according to the exemplary embodiment of the present invention.

Describing the flow of the cooling water in the heat exchanger 1 for cooling an electrical device with reference to FIG. 5.

First of all, the cooling water introduced through the inlet pipe 210 is branched into the first inlet passage 312 and the second inlet passage 313 from the inlet block 310 through the inlet passage 311 and some of the cooling water flows in the first cooling flow path 110 through the 1-1-th connection pipe 331 connected thereto and flows in the second cooling flow path 120 through the 2-1-th connection pipe 332.

At this time, the connection block 400 is coupled between the first cooling flow paths 110 configured of two layers, and the cooling water flows even in the first cooling flow path 110 of each layer therethrough.

The cooling water distributed to the respective channels flows into the other side in the longitudinal direction of the first cooling flow path 110 and the second cooling flow path 120 and then is discharged to the outlet pipe 220 connected to the outlet block 320 through the 1-2-th connection pipe 341 and the 2-2-th connection pipe 342.

Therefore, according to the exemplary embodiment of the present invention, the heat exchanger 1 for cooling an electrical device is mechanically assembled through the first and second cooling flow paths 110 and 120, which forms the cooling water flow path and the electrical devices 2, thereby facilitating the insertion of the electrical devices and enabling the pressing force between the first and second cooling flow paths 110 and 120 and the electrical device 2 to increase, such that the cooling performance is improved.

Further, according to the exemplary embodiment of the present invention, it is possible to easily cool the plurality of electrical devices 2 and expand the application range by increasing the stacked number of first and second cooling flow paths as illustrated in FIG. 6 when the number of electrical devices 2 to be cooled is increased.

The present invention is not limited to the above-mentioned exemplary embodiments but may be variously applied, and may be variously modified by those skilled in the art to which the present invention pertains without departing from the gist of the present invention claimed in the claims.

DETAILED DESCRIPTION OF MAIN ELEMENTS

1: Heat exchanger for cooling electrical device
2: Electrical device
110: First cooling flow path
111: 1-1-th protrusion
112: 1-2-th protrusion
120: Second cooling flow path
121: 2-1-th protrusion
122: 2-2-th protrusion
210: Inlet pipe
220: Outlet pipe
310: Inlet block
311: Inlet passage
312: First inlet passage
313: Second inlet passage
320: Outlet block
321: Outlet passage
322: First outlet passage
323: Second outlet passage
330: First flange
331: 1-1-th connection pipe
332: 2-1-th connection pipe
340: Second flange
341: 1-2-th connection pipe
342: 2-2-th connection pipe
350: Connector
400: Connection block
410: Upper connection block
411: First communication passage
420: Lower connection block
421: Second communication passage
430: Sealing member

The invention claimed is:

1. A heat exchanger for cooling an electrical device, comprising:
a first cooling flow path and a second cooling flow path having cooling water flowing thereinto and alternately stacked to each other;
an inlet pipe and an outlet pipe connected to both ends of the first cooling flow path and the second cooling flow path, the inlet pipe having the cooling water introduced thereinto and the outlet pipe discharging the cooling water therethrough; and
a connection block fluidically communicating with the inlet pipe and the outlet pipe and connected between the first cooling flow path and the second cooling flow path stacked in plural to form a connection channel in a stacking direction;
a 1-1-th protrusion wherein at least some area of one end thereof protrudes in a longitudinal direction of the first cooling flow path and a 1-2-th protrusion wherein at least some area of one end thereof protrudes in a longitudinal direction of the first cooling flow path; and
a 2-1-th protrusion wherein at least some area of one end thereof protrudes in a longitudinal direction of the second cooling flow path and a 2-2-th protrusion wherein at least some area of one end thereof protrudes in a longitudinal direction of the second cooling flow path,
wherein a plurality of electrical devices are inserted between the first cooling flow path and the second cooling flow path to be cooled, and
the 1-1-th protrusion and the 2-1-th protrusion and the 1-2-th protrusion and the 2-2-th protrusion do not overlap with each other in a height direction.

2. The heat exchanger of claim 1, further comprising:
an inlet block including an inlet passage communicating with the inlet pipe, a first inlet passage branched from the inlet passage so that the cooling water introduced through the inlet passage flows in the first cooling flow path, and a second inlet passage branched from the inlet passage so that the cooling water introduced through the inlet passage flows in the second cooling flow path; and
an outlet block including a first outlet passage connected to the first cooling flow path, a second outlet passage connected to the second cooling flow path, and an outlet passage connecting between the first outlet passage, the second outlet passage, and the outlet pipe so that the cooling water discharged through the first outlet passage and the second outlet passage are joined to be discharged to the outlet pipe.

3. The heat exchanger of claim 2, further comprising:
a 1-1-th connection pipe connected between the first inlet passage of the inlet block and the 1-1-th protrusion;
a 2-1-th connection pipe connected between the second inlet passage of the inlet block and the 2-1-th protrusion;
a 1-2-th connection pipe connected between the first outlet passage of the outlet block and the 1-2-th protrusion; and
a 2-2-th connection pipe connected between the second outlet passage of the outlet block and the 2-2-th protrusion.

4. The heat exchanger of claim 3, further comprising:
a first flange having the 1-1-th connection pipe and the 2-1-th connection pipe inserted thereinto and supporting the inlet block; and
a second flange having the 1-2-th connection pipe and the 2-2-th connection pipe inserted thereinto and supporting the outlet block.

5. The heat exchanger of claim 4, further comprising:
a connector that connects between the first cooling flow path, the 1-1-th connection pipe, and the 1-2-th connection pipe and connects between the second cooling flow path, the 2-1-th connection pipe, and the 2-2-th connection pipe.

6. The heat exchanger of claim 5, wherein the inlet block, the 1-1-th connection pipe, the 2-1-th connection pipe, and the connector are integrally formed, and
the outlet block, the 1-2-th connection pipe, the 2-2-th connection pipe, and the connector are integrally formed.

7. The heat exchanger of claim 2, wherein the connection block includes:
an upper connection block being in contact with the first cooling flow path or the second cooling flow path that is connected to the inlet block and the outlet block and including a first communication passage that communicates with the first inlet passage, the second inlet passage, the first outlet passage, or the second outlet passage;
a lower connection block being in contact with the first cooling flow path or the second cooling flow path connected to the first connection block or the first cooling flow path or the second cooling flow path alternately stacked to each other, and including a second communication passage communicating with the first communication passage; and a sealing member coupled to a part where the upper connection block and the lower connection block are coupled to prevent the cooling water from being leaked.

8. The heat exchanger of claim 7, wherein the sealing member is an o-ring or a liquid gasket.

9. The heat exchanger of claim 8, wherein a height of the connection block is equal to a height of any one of the first cooling flow path and the second cooling flow path and a sum of heights of two electrical devices.

10. The heat exchanger of claim 1, wherein the first cooling flow path and the second cooling flow path have an inner fin inserted thereinto.

11. The heat exchanger of claim 1, wherein the first cooling flow path and the second cooling flow path are a plate type in which two plates are coupled to each other to form a channel therein or a tube type.

12. The heat exchanger of claim 1, wherein the electrical devices are each inserted into a gap formed by the multiple stacking of the first cooling flow path and the second cooling flow path, and the gap between the first cooling flow path and the second cooling flow path is changed according to heights of the electrical devices inserted into the gap.

13. The heat exchanger of claim 1, wherein the first cooling flow path and the second cooling flow path have a shape in which some areas thereof are bent.

14. The heat exchanger for cooling an electrical device according to claim 13, wherein the first cooling flow path and the second cooling flow path have a 'U' shape.

* * * * *